(12) United States Patent
Kessner

(10) Patent No.: US 12,328,838 B2
(45) Date of Patent: Jun. 10, 2025

(54) RACK EARS AND METHODS OF USING THE SAME

(71) Applicant: Iontra Inc, Centennial, CO (US)

(72) Inventor: David Kessner, Denver, CO (US)

(73) Assignee: Iontra Inc, Centennial, CO (US)

(*) Notice: Subject to any disclaimer, the term of this patent is extended or adjusted under 35 U.S.C. 154(b) by 0 days.

(21) Appl. No.: 18/109,152

(22) Filed: Feb. 13, 2023

(65) Prior Publication Data

US 2024/0276671 A1 Aug. 15, 2024

(51) Int. Cl.
*H05K 7/14* (2006.01)

(52) U.S. Cl.
CPC .................................. *H05K 7/1489* (2013.01)

(58) Field of Classification Search
CPC .... H05K 7/1489; H05K 7/183; H05K 7/1407; H05K 5/0204; F16M 13/02; F16M 2200/028; H04Q 1/08; H02B 1/34; A47B 47/022
See application file for complete search history.

(56) References Cited

U.S. PATENT DOCUMENTS

| | | | | |
|---|---|---|---|---|
| 2,920,244 A * | 1/1960 | Miksit | ...................... | H05K 7/14 248/441.1 |
| 5,918,837 A * | 7/1999 | Vicain | ...................... | H02G 3/26 174/72 A |
| D413,473 S * | 9/1999 | Belokin | ...................... | D6/574 |
| 5,954,301 A * | 9/1999 | Joseph | ...................... | H02G 3/26 248/68.1 |
| 6,170,784 B1 * | 1/2001 | MacDonald | ........... | H05K 7/1448 248/65 |
| 6,202,570 B1 * | 3/2001 | Kurtsman | ................ | H04Q 1/08 211/187 |
| 6,556,762 B1 * | 4/2003 | Erickson | .................. | H02G 3/30 385/136 |
| 6,571,967 B2 * | 6/2003 | Belokin | ...................... | A47F 5/08 211/89.01 |
| 7,261,590 B2 * | 8/2007 | Olsen | ...................... | H04Q 1/062 439/532 |
| 7,345,241 B2 * | 3/2008 | Caveney | ................ | H04Q 1/142 174/99 R |
| 7,404,736 B2 * | 7/2008 | Herbst | ...................... | H04Q 1/13 439/557 |
| 7,929,279 B2 * | 4/2011 | Liu | ......................... | G06F 1/181 211/184 |
| 8,024,839 B2 * | 9/2011 | Lewis, II | ............... | E05D 7/1072 16/334 |
| 8,326,107 B2 * | 12/2012 | Cooke | .................. | G02B 6/4452 385/135 |

(Continued)

*Primary Examiner* — Ko H Chan
(74) *Attorney, Agent, or Firm* — Polsinelli PC; Gregory P. Durbin

(57) ABSTRACT

Disclosed herein is a rack ear for mounting equipment in an equipment rack. The rack ear can include a member that extends outward from a computing device, when the rack ear is coupled to the computing device, to an end of the member. The member can include an elongate opening that extends through the member and defines an upper lobe and a lower lobe. The elongate opening can extend through the end of the member to define a slot opening. The elongate opening can be symmetrical about a plane through the horizontal midline of the member. The member can define a height that corresponds to a 1U, 2U, 3U, or 4U dimension of the computing device.

16 Claims, 8 Drawing Sheets

(56) References Cited

U.S. PATENT DOCUMENTS

| | | | |
|---|---|---|---|
| 9,433,114 B2 * | 8/2016 | Hilburn | H05K 7/1488 |
| 9,519,118 B2 * | 12/2016 | Giraud | G02B 6/4452 |
| 9,841,574 B1 * | 12/2017 | Pilon | G02B 6/44526 |
| 10,340,674 B1 * | 7/2019 | Chompff | F16L 3/137 |
| 10,827,642 B2 * | 11/2020 | Chen | H05K 7/183 |
| 11,382,229 B2 * | 7/2022 | Wang | H05K 7/1491 |
| 11,678,741 B2 * | 6/2023 | Gonzalez | A47B 96/1408 |
| | | | 248/250 |
| 11,740,421 B2 * | 8/2023 | Van Baelen | G02B 6/44526 |
| | | | 385/135 |
| 2002/0158032 A1 * | 10/2002 | Belokin | A47F 5/08 |
| | | | 211/75 |
| 2003/0022552 A1 * | 1/2003 | Barker | H04Q 1/062 |
| | | | 439/540.1 |
| 2023/0332674 A1 * | 10/2023 | Ikeda | F16H 21/44 |

\* cited by examiner

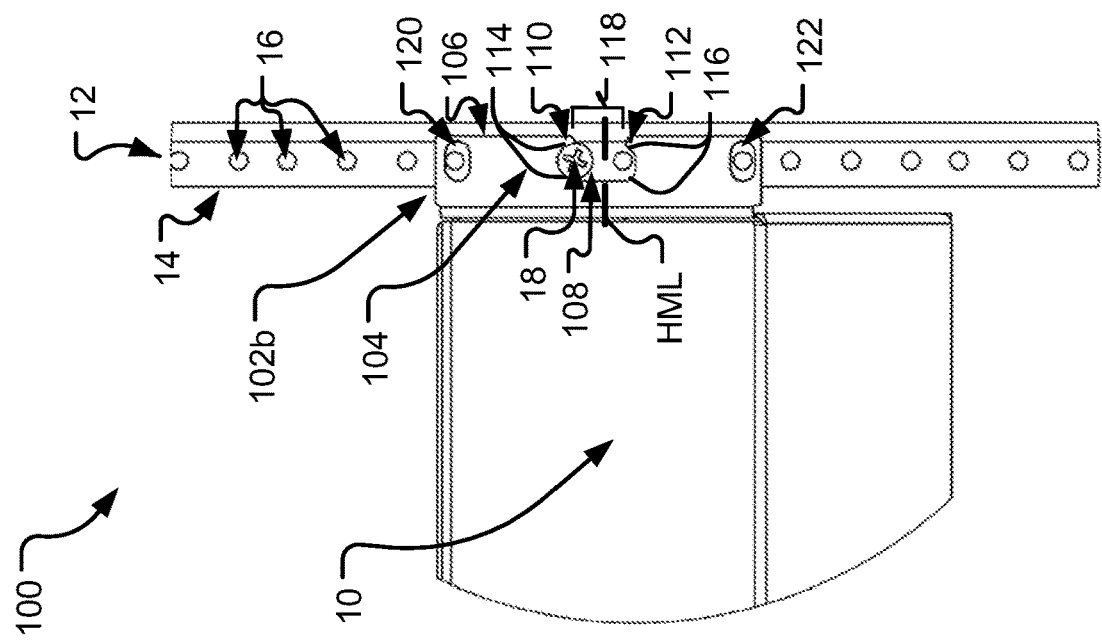
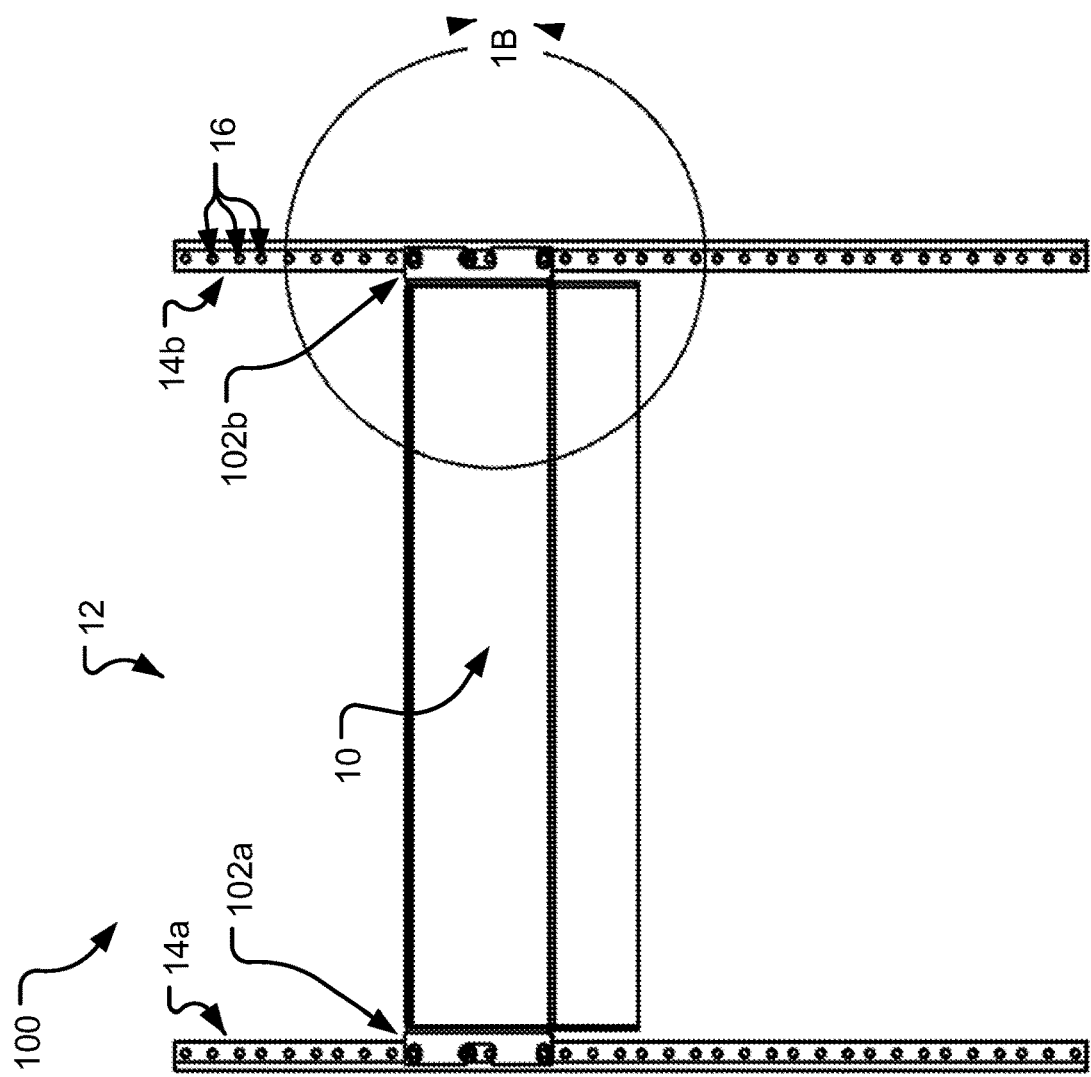
FIG. 1A
FIG. 1B

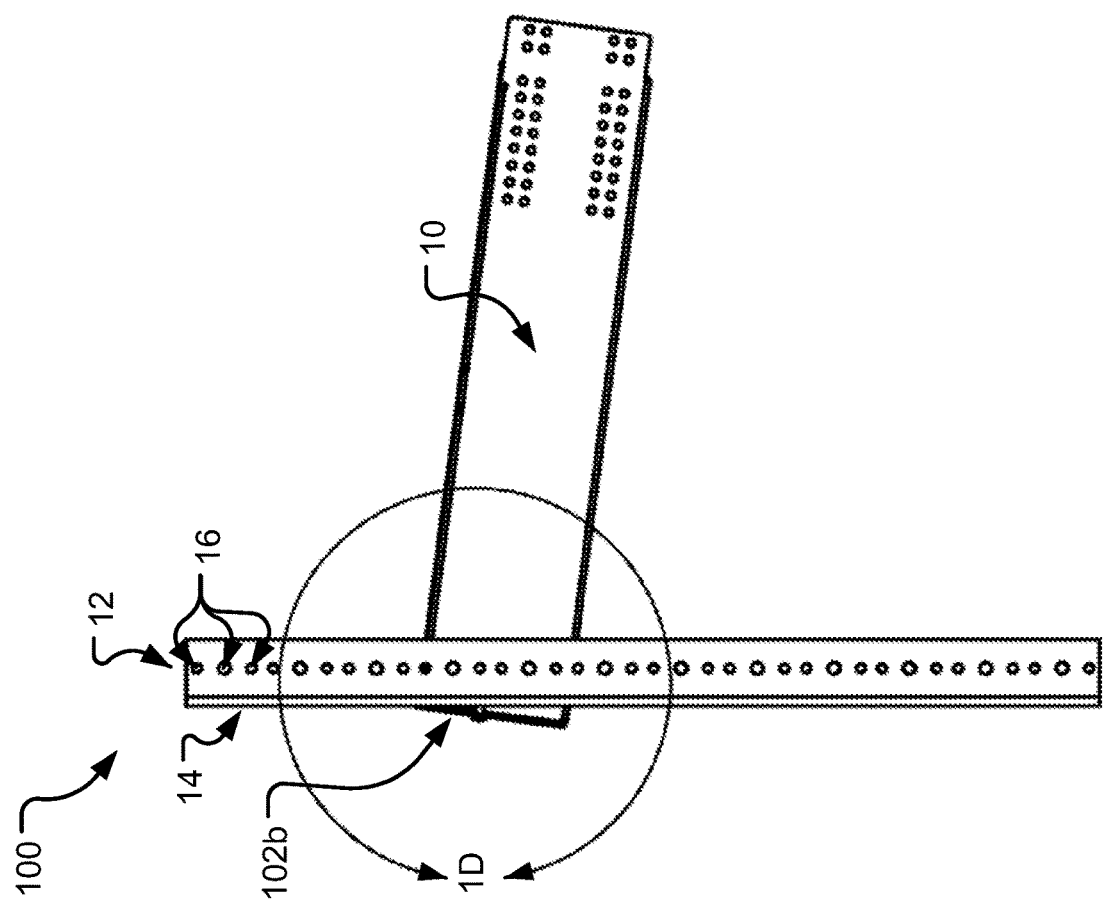
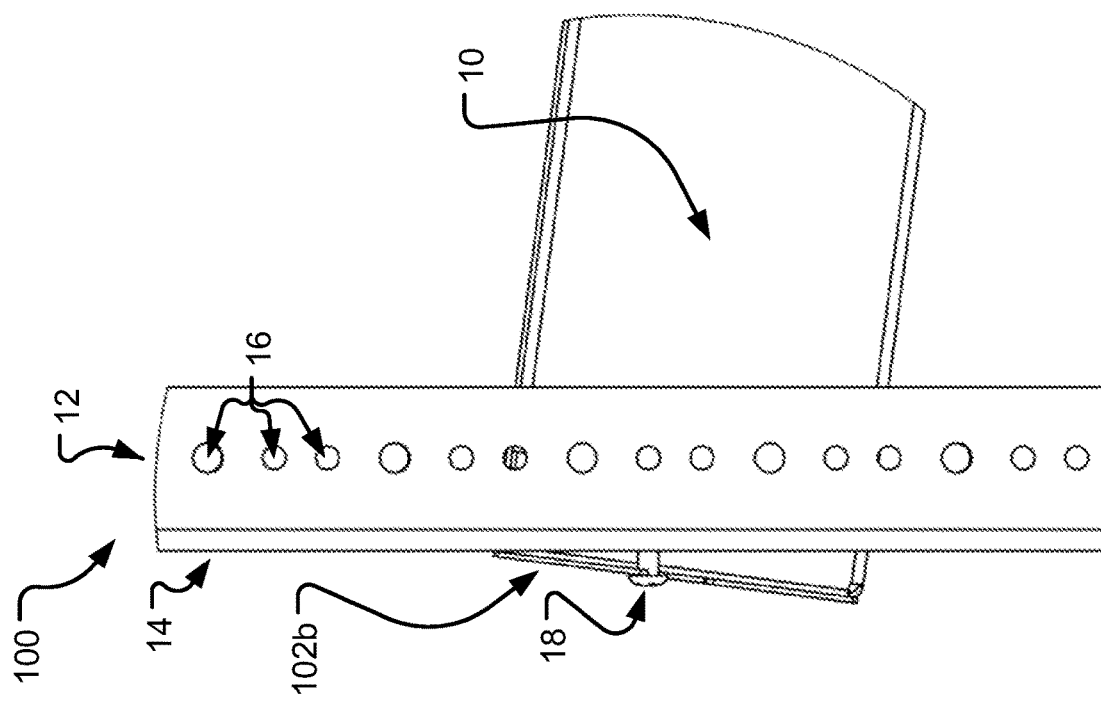
FIG. 1C
FIG. 1D

RACK EARS AND METHODS OF USING THE SAME

TECHNICAL FIELD

The present disclosure is directed to rack ears. More specifically, the present disclosure is directed to rack ears having an elongate opening to support equipment when the equipment is being mounted to an equipment rack.

BACKGROUND AND INTRODUCTION

Rack ears are used to secure equipment to the rack rails of a server rack. Traditionally, each rack ear protrudes from the equipment and contains one or more apertures that can receive a screw therethrough to fasten the rack ear, and the corresponding equipment, to a rail of the server rack. These traditional rack ears require an installer to hold the equipment in place, while also holding a screw, inserting the screw through an aperture of a rack ear, and tightening the screw. Installation tends to be awkward when attempting to hold equipment in place, place a screw or nut and bolt, and tighten it all. These issues are exacerbated when the equipment is overhead or in tight spaces.

Therefore, there is a need in the art for a rack ear that makes it easier for the installer to secure the equipment to the equipment rack. It is with these thoughts in mind, among others, that the rack ears of the present disclosure were conceived.

SUMMARY

Aspects of the present disclosure include a rack ear for mounting equipment in an equipment rack. The rack ear can include a planar member that defines an end edge. For example, the planar member extends outward from a computing device when the planar member is coupled to the computing device, to the end edge of the planar member. The member can include an elongate opening that extends through the planar member and defines an upper lobe and a lower lobe. The elongate member can also extend through the end edge of the planar member to define a slot opening into the elongate member between the upper lobe and the lower lobe. The elongate opening can be symmetrical about a line defined by the slot opening into the elongate opening. For example, the elongate opening can be symmetrical about a plane through the horizontal midline of the member such that the plane is horizontal when the upper lobe and the lower lobe are coplanar in a vertical plane. The planar member can define a height that corresponds to a 1U, 2U, 3U, or 4U dimension of a computing device.

In various possible embodiments, the upper lobe defines at least a portion of an upper curvate surface configured to engage the shaft of a support fastener. In some embodiments, the upper lobe and the lower lobe each define a curvate surface configured to engage the shaft of a support fastener. When the rack ear is advanced over the head of a support fastener and then lowered onto the shaft of the support fastener, the upper curvate surface engages the shaft of the support fastener. When the upper curvate surface engages the shaft, the upper curvate surface causes the equipment to center within the equipment rack. Moreover, when the upper curvate surface engages the shaft, the upper curvate surface inhibits both lateral movement and vertical movement of the planar member with respect to the equipment rack. For example, the curvate surface of the upper lobe can define a radius and the curvate surface of the lower lobe can define a radius. In some examples, the radius of the curvate surface of the upper lobe can be the same as the radius of the curvate surface of the lower lobe. In some examples, the radius of the curvate surface of the upper lobe and/or the radius of the curvate surface of the lower lobe can be greater than $3/32$-inch.

In various possible embodiments, the rack ear includes an upper slot above the elongate opening and a lower slot below the elongate opening. The upper slot and the lower slot can be spaced apart according to spacing of apertures on a corresponding rail of the equipment rack. For example, the upper slot and the lower slot can align with apertures on the corresponding rail such that the upper slot and the lower slot can each receive a fastener therethrough to removably couple the rack ear to the equipment rack.

In various possible embodiments, the rack ear includes a second planar member. The planar member and the second planar member form an angle bracket. For example, the planar member can be substantially perpendicular to the second planar member. The planar member can define a planar surface that, when the planar member receives one or more fasteners therethrough to removably couple the rack ear to the rail, abuts a corresponding planar surface on a rail of the equipment rack. When the rack ear is removably coupled to the rail, the planar surface of the planar member abuts the planar surface of the rail such that rotation of the rack ear is inhibited.

In various possible embodiments, the elongate opening defines a height that corresponds to openings of two apertures that are adjacent to each other on a corresponding rail of the equipment rack. For example, when the rack ear abuts the rail, the upper curvate surface of the elongate opening can align with a top surface of an upper aperture and/or the lower curvate surface of the elongate opening can align with a bottom surface of a lower aperture.

Aspects of the present disclosure include a computer rack mounting member, which includes a planar member. The planar member can be coupled to a computing element, which may be supported by a computing rack that includes a first rack member. The planar member defines a slot portion, a first lobe, and a second lobe. The first lobe and the second lobe can be symmetrically positioned relative to the slot portion. The slot portion can receive a head of a support member of the first rack member by substantial horizontal movement of the planar member to position the computing element to be supported by the computing rack. Then, one of either the first lobe or the second lobe engages the shaft of the support member through substantial vertical movement of the planar member to seat the support member in either the first lobe or the second lobe of the planar member. When the support member is seated in either the first lobe or the second lobe, the support member inhibits lateral movement and vertical movement of the planar member relative to the support member.

In various possible embodiments, the planar member is advanced over the head of the support member and then lowered onto a shaft of the support member such that the shaft of the support member is seated against either the first lobe or the second lobe. Seating the shaft of the support member against the first lobe or the second lobe causes the computing element to center within the computing rack such that a width dimension of the computing element is evenly spaced between corresponding rails of the computing rack. The first lobe can define a radius of the slot portion and the second lobe can define a radius of the slot portion. In some examples, the radius defined by the first lobe can be the same as the radius defined by the second lobe. In some examples, the radius of the first lobe and/or the radius of the second lobe can be greater than ³⁄₃₂-inch.

In various possible embodiments, the planar member includes first aperture above the slot portion and a second aperture below the slot portion. The first aperture and the second aperture can be spaced apart according to spacing of apertures on a corresponding rail of the computer rack. For example, the first aperture and the second aperture can align with apertures on the corresponding rail such that the first aperture and the second aperture can each receive a fastener therethrough to removably couple the planar member to the first rack member of the computing rack.

In various possible embodiments, the computer rack mounting member includes a second planar member. The planar member and the second planar member can form an angle bracket. For example, the second planar member can be coupled to the computing element and the planar member can extend outwards from the computing element. In various possible embodiments, the planar member defines a planar surface that can abut a corresponding planar surface on a corresponding rail of the computer rack when the planar member receives one or more fasteners therethrough to removably couple the planar member to the rail. When the planar member is removably coupled to the rail, the planar surface of the planar member abuts the planar surface of the rail such that rotation of the planar member is inhibited.

In various possible embodiments, the planar member can define a height that corresponds to a 1U, 2U, 3U, or 4U dimension of the computing element. In some examples, the slot portion can define a height that corresponds to two apertures that are adjacent to each other on a rail of the computing rack.

Aspects of the present disclosure include a rack system to support computer equipment. The rack system can include a computing device having a first planar member extending outward from a first end of the computing device. The first planar member scan be supported by a first fastener installed into a first rail of an equipment rack. The rack system can include a second planar member extending outward from a second end of the computing device. The second planar member can be supported by a second fastener installed into a second rail of the equipment rack. In some embodiments, the first planar member defines a first vertically symmetrical opening, which includes a slot through an edge of the first planar member and into the first vertically symmetrical opening defining a top lobe and a bottom lobe. The second planar member defines a second vertically symmetrical opening, which includes a slot through an edge of the second planar member and into the second vertically symmetrical opening defining a top lobe and a bottom lobe. In some embodiments, the first planar member and/or the second planar member define a height that corresponds to a 1U, 2U, 3U, or 4U dimension of the computing device. In some examples, the first vertically symmetrical opening of the first planar member can correspond to two apertures that are adjacent to each other on the first rail. The second vertically symmetrical opening of the second planar member can correspond to two apertures that are adjacent to each other on the second rail.

In various possible embodiments, the first planar member is advanced over the head of a first support fastener and then lowered onto a shaft of the first support fastener such that the shaft of the first support fastener engages either the top lobe or the bottom lobe of the first planar member. At the same or similar time, the second planar member is advanced over the head of a second support fastener and then lowered onto a shaft of the second support fastener such that the shaft of the second support fastener engages either the top lobe or the bottom lobe of the second planar member. Engaging the top lobe or the bottom lobe of the first vertically symmetrical opening with the shaft of the first fastener and engaging the top lobe or the bottom lobe of the second vertically symmetrical opening with the shaft of the second fastener causes the computing device to center within the equipment rack.

In various possible embodiments, the top lobe and the bottom lobe of the first vertically symmetrical opening each define a curvate surface. Similarly, the top lobe and the bottom lobe of the second vertically symmetrical opening each define a curvate surface. When the curvate surface of the first vertically symmetrical opening engages a shaft of the first fastener and the curvate surface of the second vertically symmetrical opening engages a shaft of the second fastener, the curvate surface of the first vertically symmetrical opening and the curvate surface of the second vertically symmetrical opening cause the computing device to center within the equipment rack.

In various possible embodiments, the first planar member includes an upper slot above the first vertically symmetrical opening and a lower slot below the first vertically symmetrical opening. The upper slot and lower slot of the first planar member can be spaced according to aperture spacing on the first rail of the equipment rack. In various possible embodiments, the second planar member includes an upper slot above the second vertically symmetrical opening and a lower slot below the second vertically symmetrical opening. The upper slot and lower slot of the second planar member can be spaced according to aperture spacing on the second rail of the equipment rack.

In various possible embodiments, the first planar member is part of a first angle bracket. When the first angle bracket is coupled to the computing device, the first planar member can extend outwards from the computing device. In various possible embodiments, the second planar member is part of a second angle bracket. When the second angle bracket is coupled to the computing device, the second planar member can extend outwards from the computing device.

BRIEF DESCRIPTION OF THE DRAWINGS

FIGS. 1A-1D illustrate examples of one embodiment of rack ears engaged with respective support fasteners to support equipment during installation into a two-post rack in a front view, detailed front view, side view, and detailed side view, respectively.

DETAILED DESCRIPTION

Figure 2B:
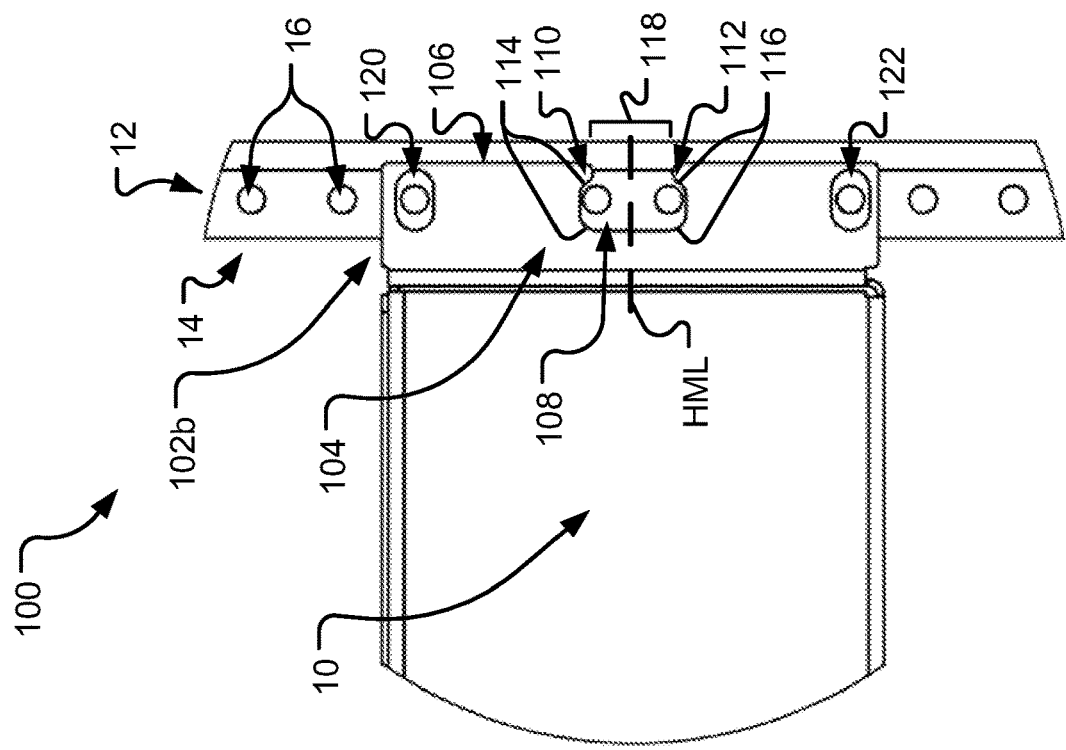
FIGS. 2A-2B illustrate another example of rack ears aligned with respective posts with the support fasteners removed in a front view and detail front view, respectively.

The present disclosure relates to a rack ear, and equipment including the same, for mounting equipment to an equipment rack. The rack ear includes a member that protrudes outward from the equipment when the rack ear is connected to the equipment. The member includes a vertically elongated cutout that extends through the thickness of the member. An opening into the elongated cutout extends from the vertically elongated cutout through an end of the member, which when connected to the equipment may be such that opening extends away from the equipment so as to receive a bolt or other member where the rack ear supports the equipment in the equipment rack. The vertically elongated cutout and the opening define an upper rounded edge extending to an upper tooth and a lower rounded edge extending to a lower tooth, either of which may capture the member (e.g., bolt) so that the rack ear securely hangs on the member when initially hung on the member. In some aspects, the upper rounded edge may be referred to as an upper curvate surface and the upper tooth may be referred to as an upper lobe. Similarly, the lower rounded edge may be referred to as a lower curvate surface and the lower tooth may be referred to as a lower lobe.

The vertically elongated cutout and opening into the cutout, together, can be dimensioned to fit over the head of a fastener, such as a screw or bolt. In other words, a portion of the combination of the cutout and the opening into the cutout can be dimensioned larger than the diameter of the head of the fastener, to receive the head of a substantially horizontal fastener therethrough during substantially horizontal movement (e.g., forward advancement) of the rack ear. A portion of the upper and lower parts of the cutout can be dimensioned to receive a shaft of the fastener but such that the head of the fastener may be secured and engage the ear. In other words, the upper rounded edge and tooth (which can be symmetrical to the lower rounded edge and tooth) can be dimensioned larger than the diameter of the shaft of the fastener, such that the upper rounded edge can receive the shaft of the fastener during substantially vertical movement (e.g., downward movement) of the rack ear and engage the shaft of the fastener. The upper rounded edge and tooth can be dimensioned smaller than the diameter of the head of the fastener, such that the upper rounded edge can engage the head.

For example, to secure the rack ears and corresponding equipment to an equipment rack, a support fastener (e.g., screw, bolt, or other threaded member) can be inserted into a rail of the equipment rack, such that the support fastener extends substantially horizontally outward from the rail (e.g., a substantially vertical rail). The support fastener can be partially tightened into the rail such that an inner surface of the head of the fastener is spaced a distance from the rail (e.g., the screw is not fully tightened, the inner surface of the head of the screw is not flush with the rail). Then, the vertically elongated cutout and the opening can be aligned with the fastener and positioned so that the head of the fastener is received through the opening, and then the equipment is allowed to move vertically such that the shaft of the fastener or other portion of the fastener rests on an edge of whatever part of the cutout is positioned upwardly. For example, the vertically elongated cutout and opening can define a vertical plane, which can be substantially perpendicular to a longitudinal axis of the support fastener when the rack ear is horizontally advanced, such that the vertically elongated cutout and opening receive the head of the support fastener therethrough. The vertical plane can be substantially perpendicular to the longitudinal axis of the fastener when the rack ear is vertically lowered such that the upper rounded edge receives the shaft of the fastener therein. The vertically elongated cutout defines a mirror image such that when the same form of rack ear may be connected to the equipment and a portion of the cutout will be positioned upwardly so that the shaft of the fastener may rest in the cutout to hold the rack in place before additional fasteners and/or the support fastener are tightened so that the heads of the additional fasteners and/or the support fastener engages the rack ear body.

When rack ears at either side of the equipment are supported on the shafts of the corresponding support fasteners (e.g., screws, bolts, or other threaded members), the upper rounded edge and the upper tooth of the respective rack ears cause the equipment to self-center within the rack. In other words, the upper rounded edge and upper tooth of each rack ear cause a width dimension of the computing element to be evenly spaced between corresponding rails of the equipment rack. Moreover, the upper rounded edge and the upper tooth inhibit lateral (e.g., horizontal) movement of the rack ear, and corresponding equipment relative to the rack from the shaft of the fastener resting in the cutout and/or the head of the fastener engaging the rack ear above the cutout. For example, the upper rounded edge and the upper tooth rest on the shaft of the support fastener, which inhibits lateral movement (e.g., to the left or to the right with respect to viewing the equipment from its outward front facing surface). As another example, the upper rounded edge and upper tooth engage the head of the support fastener, which inhibits lateral movement (e.g., to the front or to the rear with respect to viewing the equipment from its outward front facing surface). Finally, the upper rounded edge and the upper tooth also inhibit vertical movement of the rack ear, and corresponding equipment, when engaged with the fastener. The rack ears may initially rest on the respective shafts of the support fasteners, with the support fasteners not fully tightened into the respective rails. In this orientation, the equipment can hang from the supporting fasteners at a slight angle. Additional fasteners (e.g., additional screws, bolts, or other threaded members) can then be inserted through an upper opening above the vertically elongated cutout and/or a lower opening below the vertically elongated cutout of each rack ear. The additional fasteners are tightened to secure each rack ear to each respective rack rail (e.g., removably couple each rack ear to the corresponding rail). When the additional fasteners are tightened, an inner surface of each rack ear can abut an outer surface of each respective rack rail to inhibit rotation of the rack ears with respect to the rack rails. In some examples, after the additional fasteners are tightened into the upper opening and/or lower opening, the support fasteners can be tightened. In other examples, after the additional fasteners are tightened into the upper opening and/or lower opening to secure each rack ear to each corresponding rail, each support fastener can be removed because each rack ear is supported by the additional fasteners through the upper opening and/or lower opening.

The rack ears disclosed herein may provide advantages over conventional rack ears. For example, the rack ears may allow a single installer to install equipment into an equipment rack easily and safely. In some embodiments, the elongated opening can allow the installer to hang the rack ear from a partially tightened support fastener (e.g., screw, bolt, pr other threaded member) such that the elongated opening supports the equipment while the installer holds and tightens additional fasteners (e.g., into the upper opening and/or lower opening) to secure the rack ear, which thereby secures the corresponding equipment. In other words, the cutout and opening into the cutout can reduce or eliminate the need for the installer to support the equipment while installing fasteners through the rack ears to secure the equipment. The rack ears disclosed herein may provide other advantages over conventional rack ears as described herein.

As another example, the rack ears may be simpler to manufacture and use than conventional rack ears. For example, the rack ear is symmetrical about a horizontal axis, which may provide advantages over alternative designs, such as a keyhole. The rack ears disclosed herein are interchangeable. In other words, the rack ears can be used on either side (e.g., left side or right side) of the equipment, whereas a keyhole design may be side specific. Additionally, the rack ears disclosed herein optimize manufacturing since the rack ears are symmetrical about the horizontal axis and interchangeable.

FIGS. 1A-1D illustrate one instance of a rack system 100. The rack system 100 includes one or more rack ears 102 (e.g., 102a, 102b) that can be used to mount an equipment module 10 to an equipment rack 12. Because the rack ears 102 can be symmetrical about a horizontal axis (e.g., horizontal midline HML), as discussed below and as best illustrated in FIG. 1B or 2B, each rack ear 102 can be interchangeable on either side of the equipment module 10. In other words, a given rack ear 102 can be coupled to the equipment 10 at either its left end (e.g., rack ear 102a) or its right end (e.g., rack ear 102b). Each rack ear 102 can be coupled to the equipment module 10. Then, each rack ear 102 can be removably coupled to a corresponding rack member 14 of the equipment rack 12, thereby securing the equipment module 10 to the equipment rack 12. In this manner, each rack ear 102 supports the equipment module 10 in the equipment rack 12.

In some instances, a pair of rack ears 102 (e.g., 102a, 102b) can be used to removably couple the equipment module 10 to an equipment rack 12, as illustrated for example in FIGS. 1A-1D. For example, a pair of rack ears 102a, 102b can extend from the equipment module 10 at its front end. In other instances, a first pair of rack ears 102 (e.g., 102a, 102b) and a second pair of rack ears 402 (e.g., 402a, 402b) can be used to removably couple the equipment module 10 to an equipment rack. For example, a pair of rack ears 402a, 402b can extend from the equipment module 10 at its rear end, in addition to a pair of rack ears 102a, 102b at its front end, as illustrated for example in FIGS. 4A-4B. The rack ears 102 at the front end and rack ears 402 at the rear end of the equipment module 10 can be interchangeable and/or can have many of the same features, which makes the rack ears 102, 402 easy to use and also optimizes manufacturing as the same rack ears 102 may be used for any and all corners of the equipment module 10.

The equipment module 10 can be, for example, a rack chassis, a computing element, a computing device, or can otherwise include electronic equipment. In at least one example, the equipment module 10 can include a printed circuit board (PCB), electrical components, and one or more batteries arranged such that the batteries can be tested. The equipment rack 12 can be, for example, a computing rack. In some instances, the equipment rack 12 can include one or more rack members 14 (e.g., 14a, 14b), which can be, for example, posts or rails. Each rack member 14 can include one or more apertures 16, which can receive a fastener 18 (e.g., screw, bolt, other threaded member) therethrough.

Each rack ear 102 includes a member 104 (e.g., planar member) that, when the rack ear 102 is coupled to the equipment module 10, extends outward (e.g., protrudes) from the equipment module 10 to an end 106 of the member 104 opposite the equipment module 10 The member 104 can be, for example, a planar member. In some instances, when the rack ear 102 is coupled to the equipment module 10, the member 104 is substantially perpendicular to a side face to the equipment module 10, which may also be generally parallel with a front face of the equipment module 10. The member 104 can define a planar surface that, when the rack ear 102 is removably coupled to the rack member 14, the planar surface of the member 104 abuts a planar surface of the rack member 14.

The rack ears 102 can correspond to an equipment rack 12 having a standard frame size. As nonlimiting examples, the rack ears 102 can correspond to an equipment rack 12 having a 19-inch rack frame or a 23-inch rack frame. The member 104 can define a height, which can be measured from the top of the member 104 to the bottom of the member 104. In some instances, the height of the member 104 can correspond to a rack unit (U) dimension of the equipment module 10. For example, the height of the member 104 can correspond to a 1U, 2U, 3U, or 4U dimension. In other words, although the figures illustrate rack ears 102 coupled to equipment module 10 having a 2U dimension, the rack ears 102 can be sized for use with equipment module 10 that has a 1U, 3U, or 4U dimension, or otherwise.

The member 104 defines an elongate opening 108, which extends through the member 104 thickness (e.g., the outer surface of the member 104 to the inner surface of the member 104). The elongate opening 108 defines a height. In some examples, the height of the elongate opening 108 corresponds to two apertures 16 that are adjacent to each other on a rack member 14 (e.g., from the top of a first aperture to the bottom of a second aperture), as best illustrated in FIG. 2B. The elongate opening 108 can define an upper lobe 110 and a lower lobe 112. The upper lobe 110 can define an upper curvate surface 114. Similarly, the lower lobe 112 can define a lower curvate surface 116.

In some instances, the elongate opening 108 can be symmetrical about a line defined by the slot opening 118 into the elongate opening 108. For example, the elongate opening 108 can be symmetrical about the horizontal midline HML of the member 104. In other words, the elongate opening 108 can be symmetrical about a plane through a horizontal midline HML of the member 104 such that the plane is horizontal when the upper lobe 110 and lower lobe 112 are coplanar in a vertical plane. In this manner, the elongate opening 108 and the slot opening 118 can define a horizontally symmetrical aperture. In some instances, a slot portion of the member 104 can include the elongate opening 108 and the slot opening 118. The slot portion can define the upper lobe 110 and lower lobe 112, which can be symmetrically positioned relative to the slot portion.

Each lobe 110, 112 and/or each curvate surface 114, 116 can engage a support member, which can be for example a fastener 18 (e.g., screw, bolt, or other threaded member), to support the equipment module 10 within the equipment rack 12 during installation. For example, the upper lobe 110 and/or upper curvate surface 114 can engage and be supported by a support member, such as a fastener 18, such that the position of the rack ears 102 and the corresponding equipment module 10 are maintained during installation, as discussed below.

Each lobe 110, 112 and/or each curvate surface 114, 116 can cause the equipment module 10 to self-center within the equipment rack 12 when the rack ear 102 engages and is supported by a fastener 18 during installation. For example, when the upper curvate surface 114 is lowered onto (e.g., engages) the shaft of a partially tightened fastener 18 protruding from the rack member 14 of an equipment rack 12, the equipment module 10 self-centers within the equipment rack 12.

Each lobe 110, 112 and/or each curvate surface 114, 116 can define a radius. The radius of each lobe 110, 112 and/or each curvate surface 114, 116 can be greater than the radius of the shaft of the support fastener 18 and/or less than the radius of the head of the fastener 18. When the radius of each lobe 110, 112 and/or each curvate surface 114, 116 is greater than the radius of the shaft of the fastener 18, the lobe 110, 112 and/or curvate surface 114, 116 can receive the shaft of the fastener 18 when the rack ear 102 is lowered onto the fastener 18. After the rack ear 102 is lowered, the shaft of each fastener 18 can support each lobe 110, 112 and/or each curvate surface 114, 116. When the radius of each lobe 110, 112 and/or each curvate surface 114, 116 is less than the radius of the head of the fastener 18, an inner surface of the head of the fastener 18 can engage the member 104. For example, when the fastener 18 is partially tightened (as illustrated for example in FIGS. 1A-1D), the inner surface of the head of the fastener 18 can engage the member 104 (e.g., above the elongate opening 108, at the lobe 110 and/or curvate surface 114). As another example, when the fastener 18 is tightened (such as if the fastener 18 was illustrated in FIGS. 2A-2B), the inner surface of the head of the fastener 18 can engage the member 104. In this manner, the radius of each lobe 110, 112 and/or each curvate surface 114, 116 can correspond to the radius of a fastener 18 (e.g., radius of the shaft of the fastener 18) for use in equipment racks 12, as illustrated for example in FIG. 1B. For example, the radius of the upper curvate surface 114 and/or lower curvate surface 116 can be sized corresponding to 10-32 screws, 12-24 screws, or M6 screws. In at least one example, the radius of the upper curvate surface 114 and/or lower curvate surface 116 can be greater than 3/32-inch.

The elongate opening 108 can extend through the end 106 (e.g., end edge) of the member 104 to define a slot opening 118. The slot opening 118 can extend from the end 106 of the member 104, between the upper lobe 110 and lower lobe 112, into the elongate opening 108. In other words, there is not a sidewall (e.g., connection between the upper lobe 110 and lower lobe 112) at the end 106 of the member 104 opposite the equipment module 10. The slot opening 118 provides advantages over alternative designs, such as an oversized slot that has a sidewall connecting the upper lobe 110 and the lower lobe 112. For example, the slot opening 118 can accommodate variability in the width of the equipment rack 12 (e.g., the spacing between a first rack member 14a and a second rack member 14b), as best illustrated in FIG. 1A. A sidewall, if present, could prevent installation of the rack ears 102a, 102b if the rack members 14a, 14b are spaced farther apart than typical. In other words, if the rack members 14a, 14b are spaced farther apart than typical, the sidewall would not fit around the heads of each respective fastener 18. As another example, a sidewall, if present, would be thin, which may create a weak point that is prone to damage during installation. On the other hand, the slot opening 118 and elongate opening 108 can be dimensioned to fit over the head of a support fastener 18. In other words, at least a portion of the elongate opening 108 together with at least a portion of the slot opening 118 can define an opening that is larger than the diameter of the head of the fastener 18 so that the elongate opening 108 and slot opening 118 can receive the head of the fastener 18 (e.g., a partially tightened fastener 18) as the rack ears 102 are advanced horizontally toward the corresponding rack members 14a, 14b (e.g., horizontal forward movement). For example, when the rack ear 102 is advanced horizontally, a portion of the head of the fastener 18 can be received through the slot opening 118 and a portion of the head can be received through the elongate opening 108.

The slot opening 118 can be dimensioned to receive at least a portion of the head of a fastener 18 therethrough (e.g., the head of a support fastener 18 that is not fully tightened into a rack member 14) during installation of the rack ear 102. For example, the center (e.g., a point along the horizontal midline HML) of the elongate opening 108 and slot opening 118 can be aligned with the longitudinal axis of a partially tightened support fastener 18 (e.g., with the rack ear 102 in a substantially vertical position). Then, the member 104 can be advanced such that the head of the fastener 18 is received through the elongate opening 108 and slot opening 118. In other words, when the member 104 is advanced towards the equipment rack 12, the slot opening 118 allows the head of the fastener 18 to be received through the member 104. The dimensions of the elongate opening 108 and slot opening 118 can be dimensioned to accommodate variability in the equipment rack 12 (e.g., rack members 14) and/or various size fasteners 18, as previously discussed.

Each member 104 can include an upper aperture 120 (e.g., upper slot) above the elongate opening 108 and/or a lower aperture 122 (e.g., lower slot) below the elongate opening 108. Each aperture 120, 122 can define a diameter (e.g., the diameter can be a height for a horizontal slot) that is greater than the diameter of the shaft of a fastener such that each aperture 120, 122 can receive the shaft of a fastener (e.g., screw, bolt, or other threaded member) therethrough. The diameter of each aperture 120, 122 can be less than the diameter of the head of the fastener such that tightening the fastener causes a surface of the head of the fastener to engage the body of the member 104 (e.g., tightening the fastener removably couples the member 104 to an equipment rack 12). In other words, each rack ear 102 can receive one or more fasteners therethrough to removably couple each respective rack ear 102, and the associated equipment module 10, to the equipment rack 12. The upper aperture 120 and lower aperture 122 are spaced apart according to the spacing of apertures 16 on the rack member 14 of the equipment rack 12, as illustrated for example in FIG. 1B. In other words, when the upper curvate surface 114 engages the shaft of a fastener 18 and the member 104 is parallel to the rack member 14, the upper aperture 120 and lower aperture 122 of the member 104 each align with an aperture 16 of the rack member 14.

In some instances, the member 104 can be substantially perpendicular to a second member 404, as illustrated for example in FIGS. 5A-5D, thereby forming an angle bracket. In some instances, the second member 404 can be coupled to the equipment module 10 and the member 104 extends outward from the equipment module 10.

The following procedure can be used to install a pair of rack ears 102 (e.g., 102a, 102b), and the corresponding equipment module 10, into an equipment rack 12 having a pair of rack members 14 (e.g., 14a, 14b). Although this procedure discusses a pair of rack ears 102a, 102b at the front end of the equipment module 10 (as illustrated for example in FIGS. 1A-1D, FIGS. 2A-2B, and FIGS. 3A-3D), the same procedure can be used when a pair of rack ears 402 is also included at the rear of the equipment module 10 (as illustrated for example in FIGS. 4A-4B).

A fastener 18 is inserted into the first rack member 14a and, correspondingly, a fastener 18 is inserted into the second rack member 14b, as illustrated for example in FIGS. 1A-1D. The fasteners 18 are installed into rail apertures 16 at the same height on each respective rack member 14. The fasteners 18 can be partially tightened and left loose (e.g., loose by approximately 3 mm), as best illustrated in the detailed side view in FIG. 1D. In other words, an inner surface of each fastener 18 can be spaced a distance (e.g., approximately 3 mm) from an outer surface of the respective rack member 14.

The elongate opening 108 and slot opening 118 of the member 104 of each rack ear 102 is aligned with each respective fastener 18 (e.g., aligned with the longitudinal axis of each fastener 18). In other words, the first rack ear 102*a* is aligned the fastener 18 in the first rack member 14*a* and the second rack ear 102*b* is aligned with the fastener 18 in the second rack member 14*b*.

The rack ears 102*a*, 102*b*, and the corresponding equipment module 10, are advanced (e.g., substantially horizontal movement) with the equipment between the rack members 14 (e.g., vertical rack rails) until each elongate opening 108 and slot opening 118, together, has received the head of each respective fastener 18 therethrough. The slot opening 118 is dimensioned sufficiently so that at least a portion of the head of the fastener 18 can be received through the slot opening 118. Then, the rack ears 102*a*, 102*b*, and the corresponding equipment module 10, are lowered (e.g., substantially vertical movement) until the upper lobe 110 and/or upper curvate surface 114 of each rack ear 102*a*, 102*b* engages and is supported by the shafts of the respective fasteners 18, as illustrated for example in FIGS. 1A-1D. The curvate surfaces 114, 116 of the respective lobes 110, 112 may be dimensioned with a radius sufficient to receive the shaft of the fastener 18, which may be about the same size as the apertures 16 in the rack member 14 that the fasteners 18 engage, but less than the size of the head of the fastener 18. The weight of the equipment module 10 (e.g., due to gravity) in a two-rack member 14 (e.g., two post) installation can cause the equipment module 10 to define an angle with respect to the rack members 14, as illustrated for example in FIGS. 1A-1D, when the shafts of the partially tightened fasteners 18 support the rack ears 102. In other words, the upper lobe 110 and/or upper curvate surface 114 engage the shaft of the fastener 18 to support the rack ears 102, and the head of the fasteners 18 engage the body of the rack ear 102 so that even prior to the tightening of the respective fasteners 18, the head inhibits horizontal movement of the equipment module 10 and the shaft inhibits vertical movement of the equipment module 10.

When engaged with the shaft of the fastener 18, the upper lobe 110 and/or upper curvate surface 114 of each rack ear 102*a*, 102*b* can cause the equipment module 10 to self-center on the equipment rack 12. In other words, the upper lobe 110 and/or upper curvate surface 114 of the first rack ear 102*a* and the upper lobe 110 and/or upper curvate surface 114 of the second rack ear 102*b* width cause a width dimension of the equipment module 10 to be evenly spaced between corresponding rails 14 of the equipment rack 12, as best illustrated in the front view in FIG. 1A. Additionally, the upper lobe 110 and/or upper curvate surface 114 of each rack ear 102*a*, 102*b* can prevent the equipment module 10 from sliding to the left or to the right (e.g., inhibit lateral movement). Moreover, the upper lobe 110 and/or upper curvate surface 114 of each rack ear 102*a*, 102*b* engage the shaft of the fastener 18, which prevents the equipment module from moving downward (e.g., inhibit vertical movement).

Figure 2A:
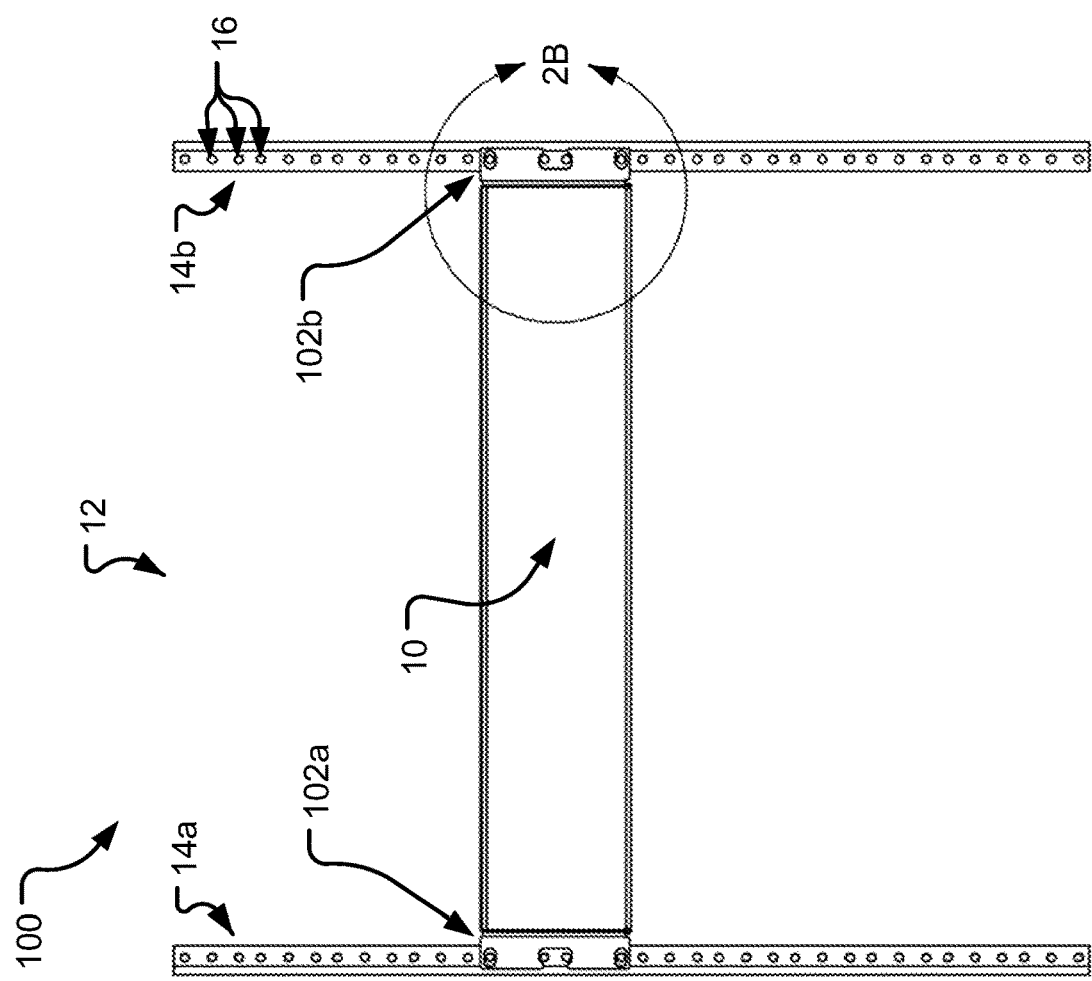
Figure 3A:
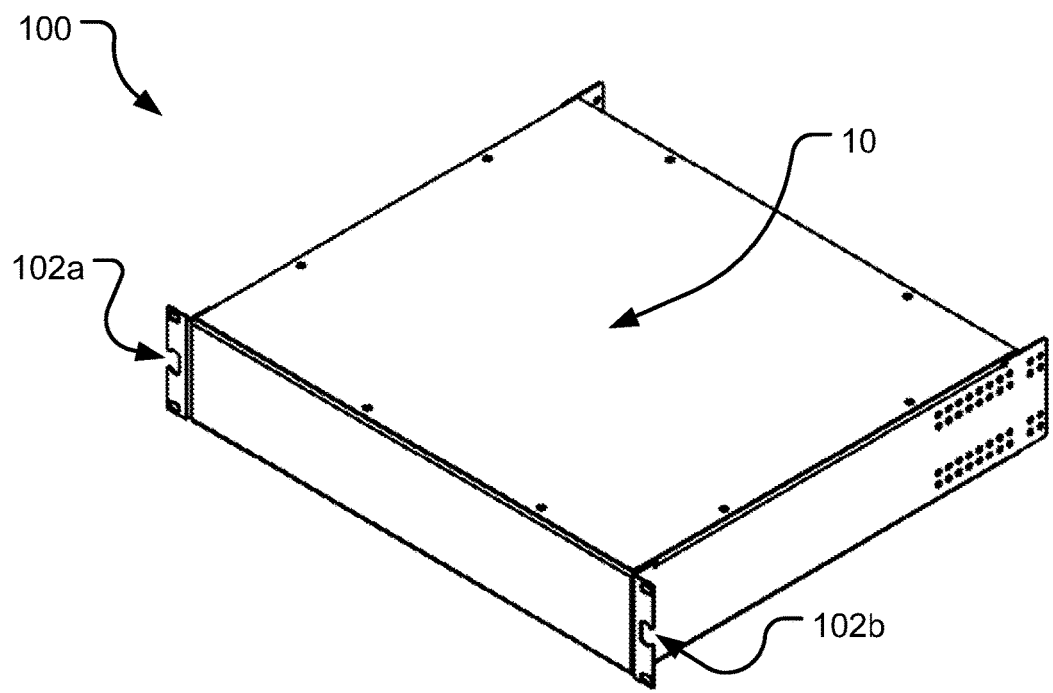
FIGS. 3A-3D illustrate examples of two rack ears extending from equipment in a perspective view, top view, front view, and detailed front view, respectively.
Figure 3B:
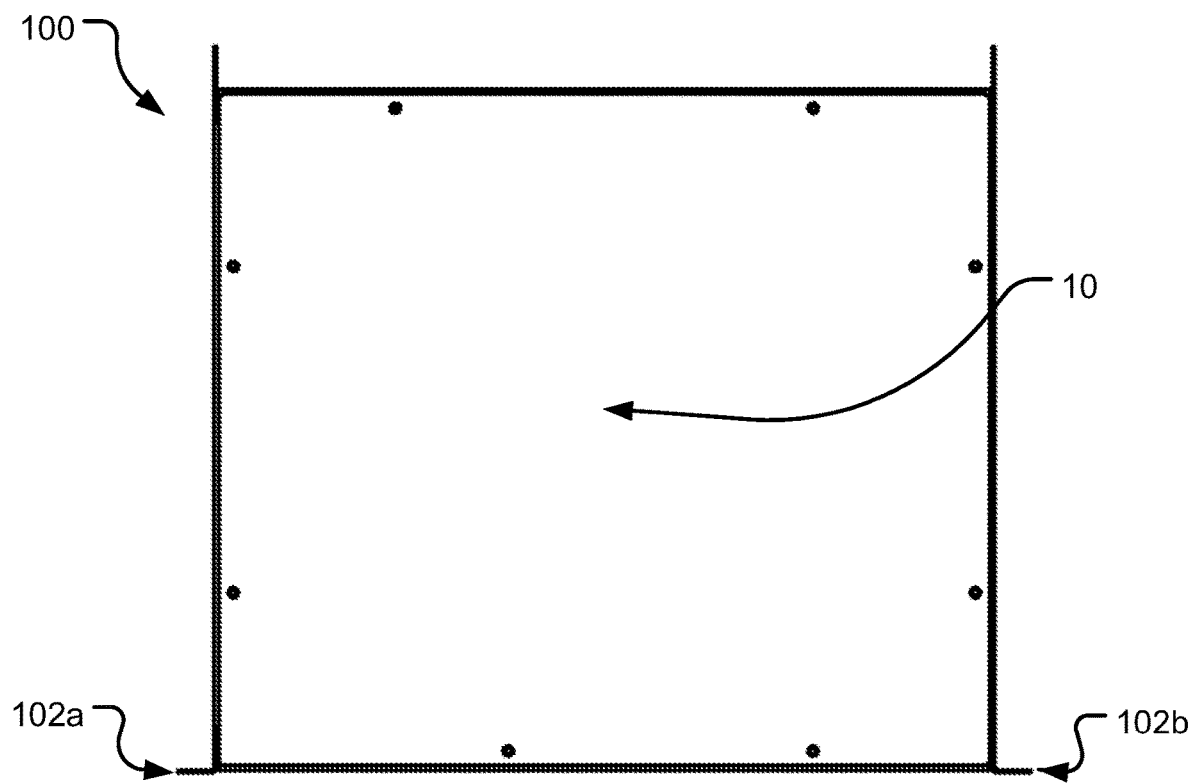
Figure 3C:
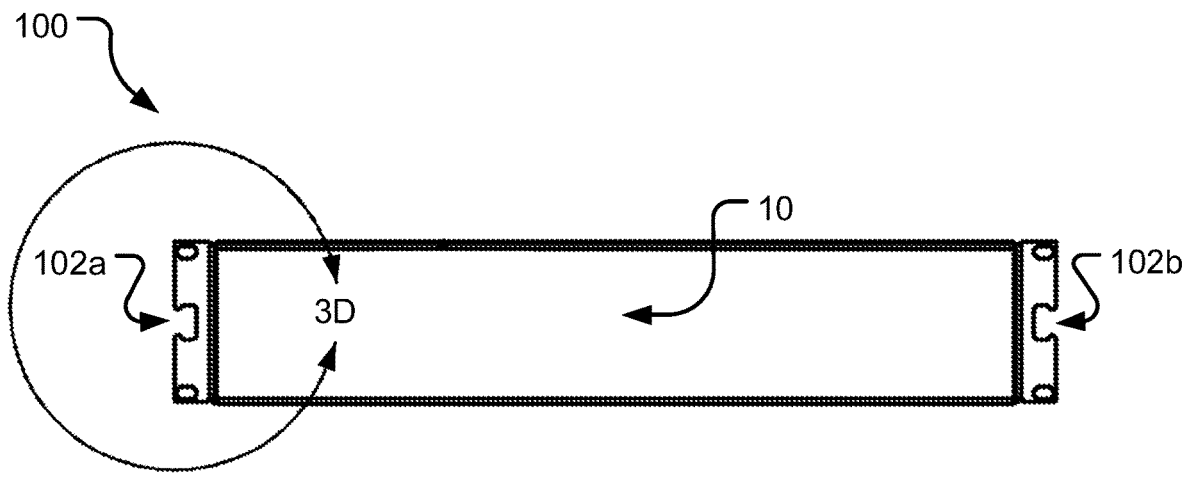
Figure 3D:
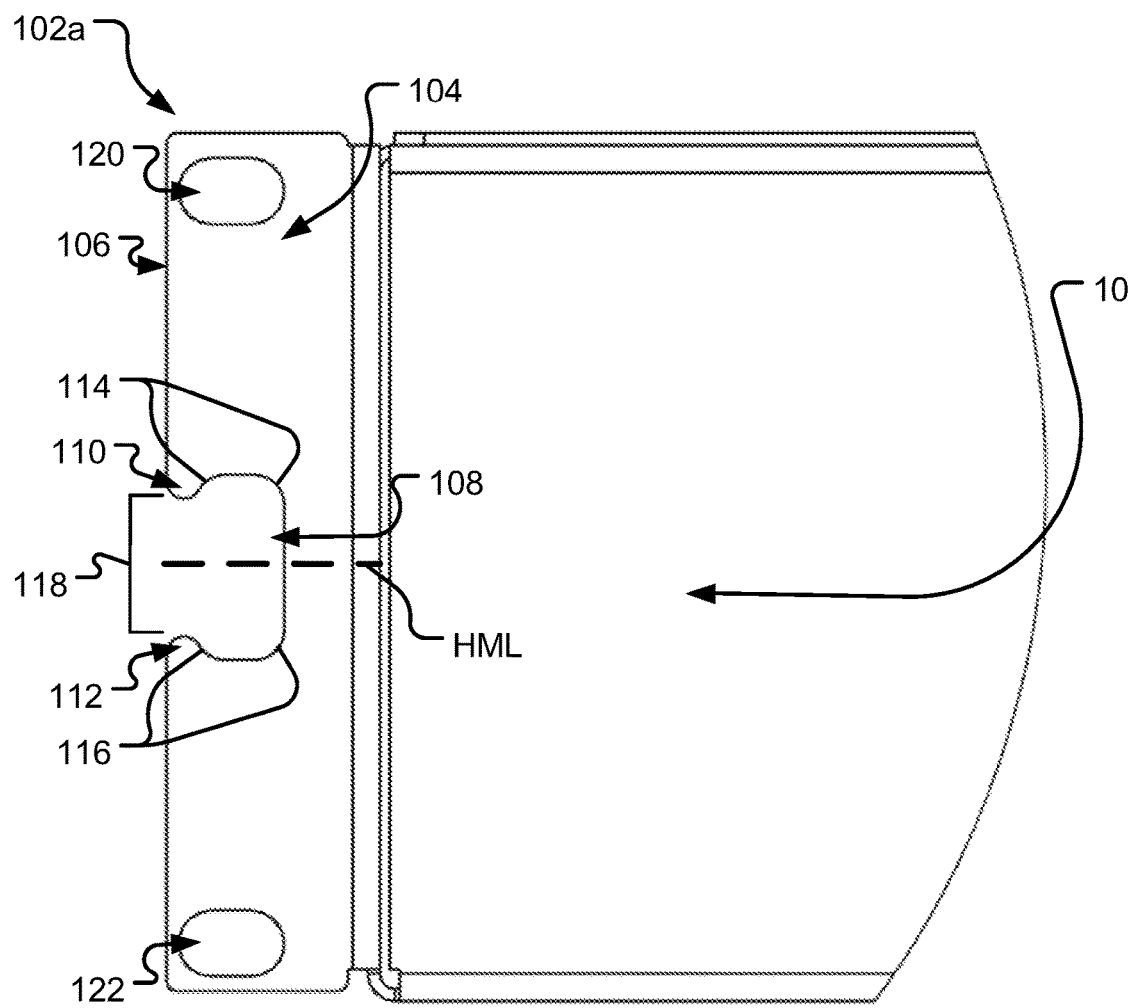

At least one fastener (not shown in the figures) can be inserted through the upper aperture 120 and/or lower aperture 122 of each respective rack ear 102*a*, 102*b* and tightened to removably couple the rack ear 102 to the rack member 14. The diameter of the apertures 120, 122 (e.g., the height for a horizontal slot) can be greater than or equal to the diameter of the shaft of the fasteners, such that the apertures 120, 122 can receive the shaft of the fasteners therethrough. The diameter of the apertures 120, 122 can be less than or equal to the diameter of the head of the fasteners, such that the head of the fasteners can engage the rack ears 102 when the fasteners are tightened. After the fasteners are tightened into the apertures 120, 122, the member 104 of each rack ear 102*a*, 102*b* can abut the rack member 14, as best shown in FIGS. 2A-2B (although the fasteners are not shown), such that each rack ear 102*a*, 102*b* inhibits rotation of the equipment module 10. In some examples, the bottom and/or top surface of the equipment module 10 can be substantially perpendicular to a surface of the rack member 14. The original supporting fasteners 18, which can be supporting the upper lobe 110 and/or upper curvate surface 114 of each rack ear 102*a*, 102*b* during installation (e.g., to allow the installation of fasteners through the apertures 120, 122), can be tightened or can be removed. If the supporting fasteners 18 are tightened, the head of each fastener 18 engages the member 104 (e.g., engages above the upper curvate surface 114, engages a portion of the upper lobe 110). If the supporting fasteners 18 are removed, the fasteners through the apertures 120, 122 support each respective rack ear 102*a*, 102*b*. The tightened fasteners, which includes the fasteners at the apertures 120, 122 and can include the original supporting fasteners 18 at the elongate opening 108, support each respective rack ear 102*a*, 102*b* and the corresponding equipment module 10. In this manner, each rack ear 102 is removably coupled to a rack member 14 of an equipment rack 12, thereby securing the equipment module 10 to the equipment rack 12.

The rack ears 102, 402 disclosed herein can be easier to use than alternative designs because installation only requires tools (e.g., screwdriver) and supplies (e.g., fasteners) that are typically used to install equipment modules 10. For example, the member 104 is supported by a fastener 18 during installation and removably coupled with additional fasteners. In other words, the rack ears 102, 402 disclosed herein do not require alternative equipment rack 12 and/or rack member 14 design, special fasteners, or special tools.

FIGS. 3A-3D illustrate one instance of the rack system 100 with a pair of rack ears 102 (e.g., 102*a*, 102*b*) protruding from an equipment module 10 at its front end. A first rack ear 102*a* extends outward from a first end of the equipment module 10 and a second rack ear 102*b* extends outward from a second end of the equipment module 10 opposite the first end at the front end of the equipment module 10. This configuration of two rack ears 102*a*, 102*b* can be used to mount the equipment module 10 to an equipment rack 12 that has two rack members 14 (e.g., two-post rack), as illustrated for example in FIGS. 1A-1D. The first rack ear 102*a* can be removably coupled to a first rack member 14*a* and the second rack ear 102*b* can be removably coupled to a second rack member 14*b*, as described above to secure a rack ear 102 to a rack member 14.

Figure 4A:
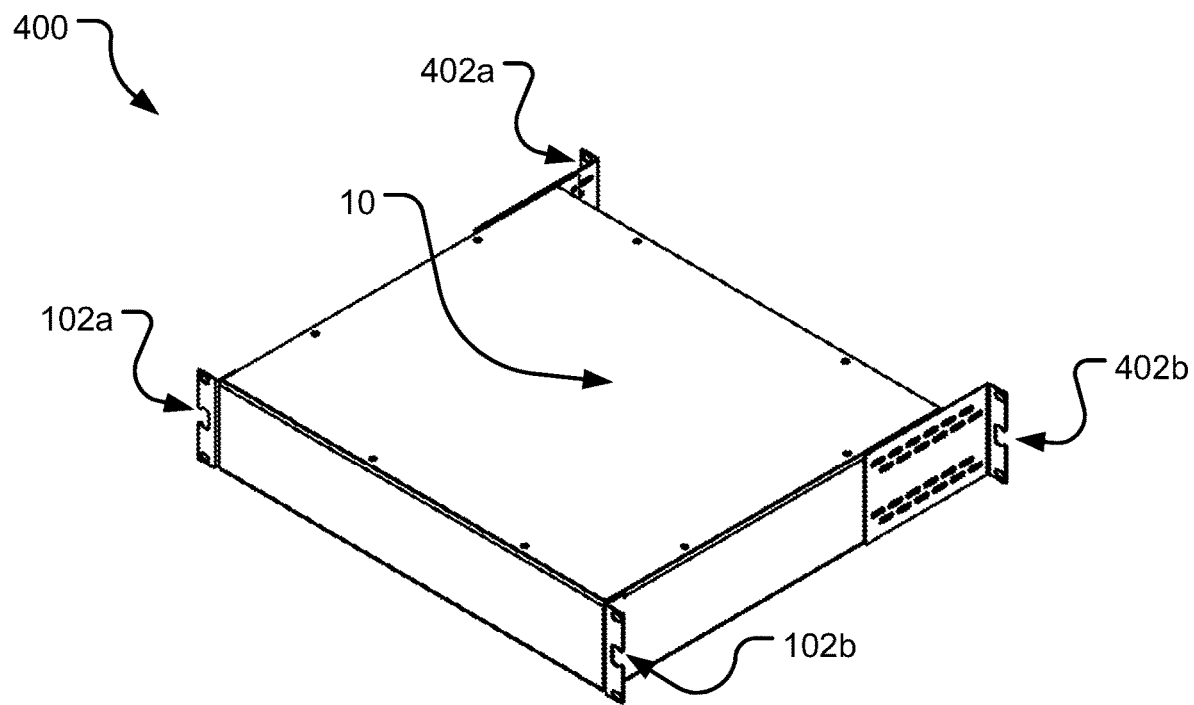
FIGS. 4A-4B illustrate examples of four rack ears extending from equipment in a perspective view and a top view, respectively.
Figure 4B:
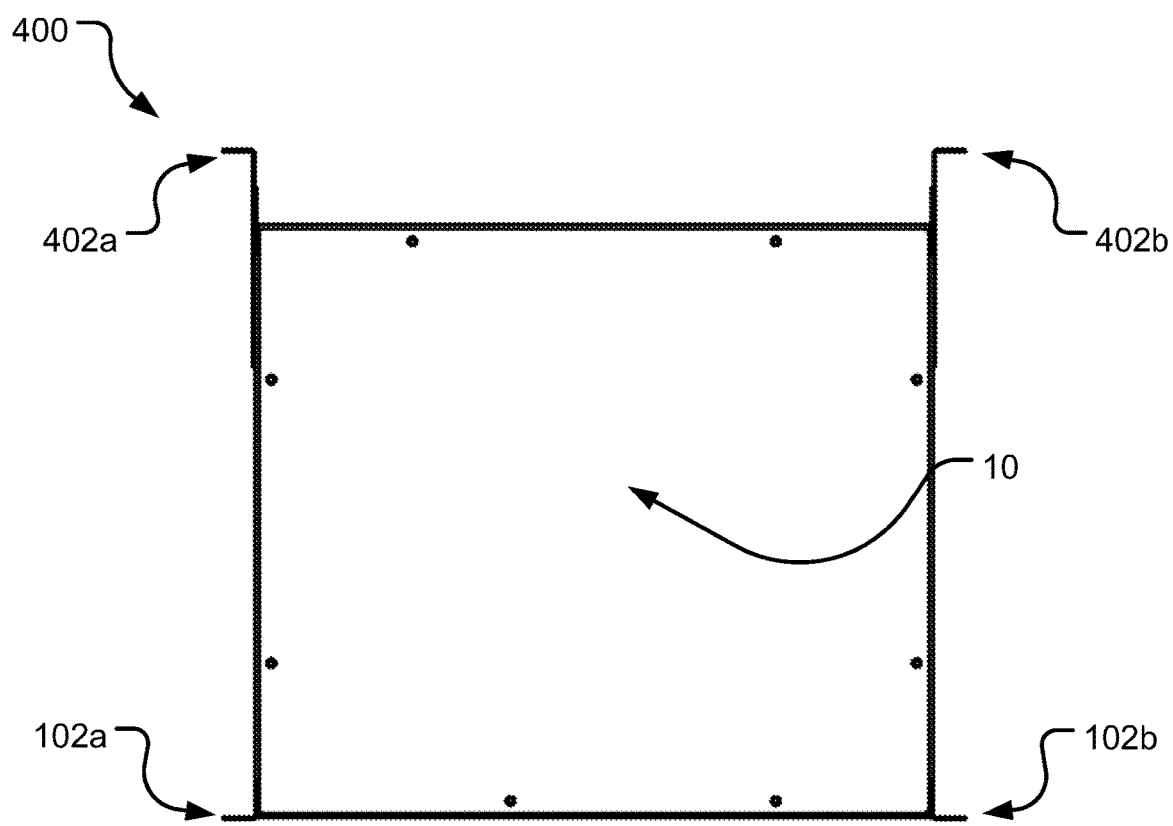
Figure 5A:
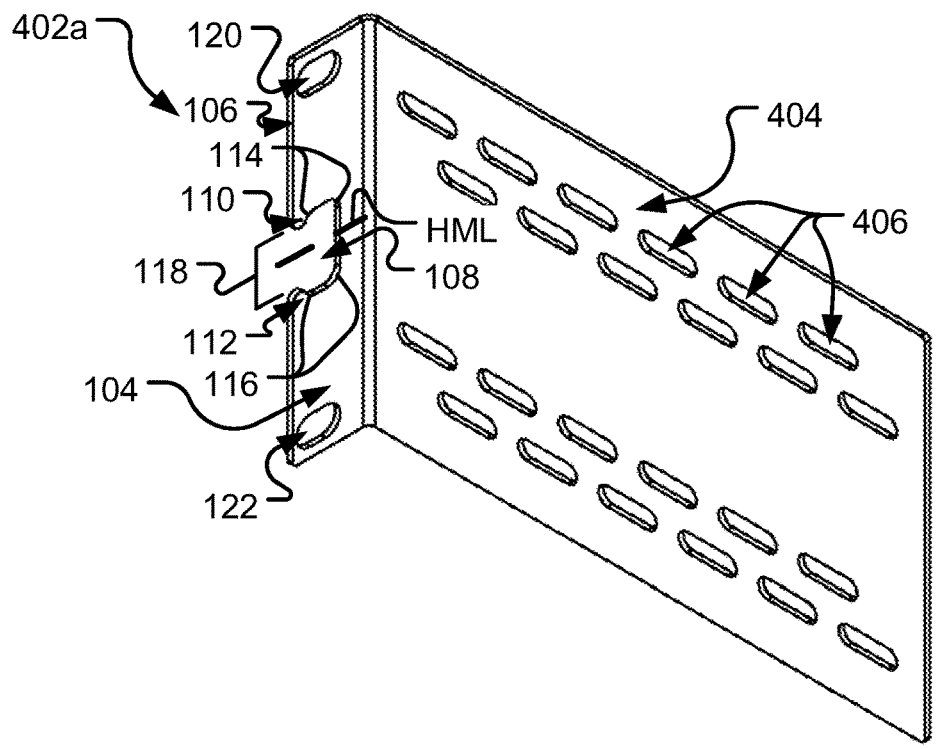
FIGS. 5A-5D illustrate an example of a rack ear in a perspective view, front view, side view, and top view, respectively.
Figure 5B:
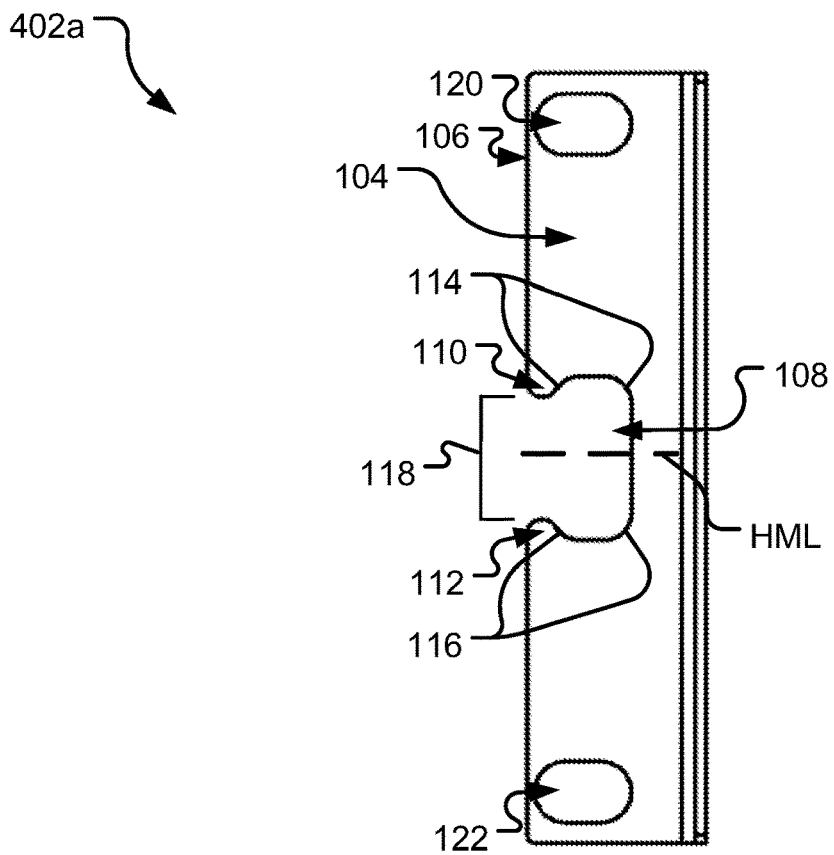
Figure 5C:
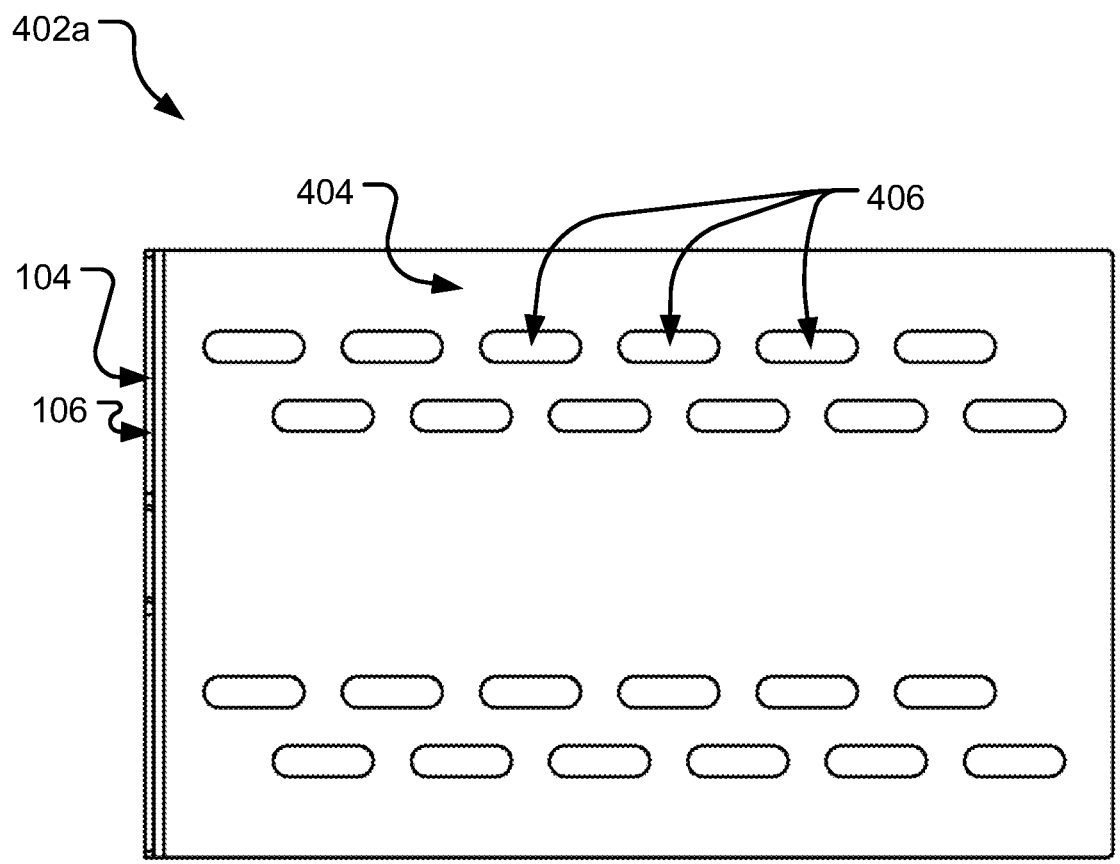
Figure 5D:
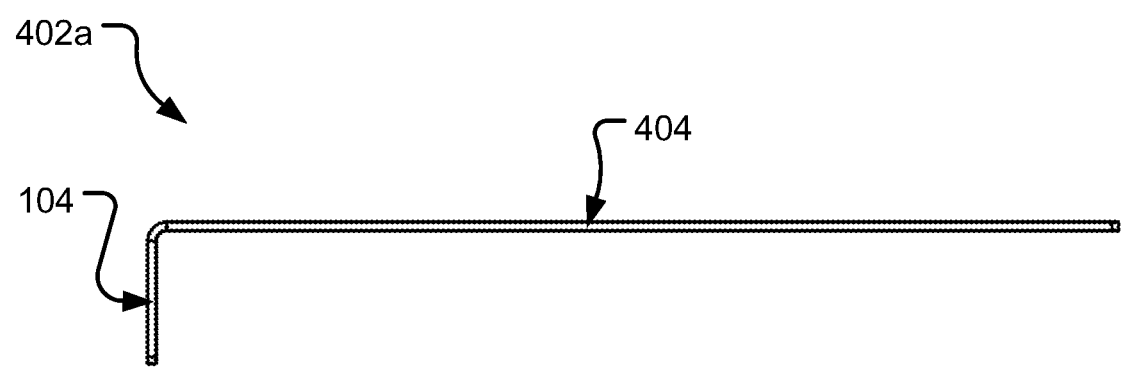

FIGS. 4A-4B illustrate one instance of a rack system 400 with a pair of rack ears 102 (e.g., 102*a*, 102*b*) protruding from the equipment module 10 at its front end and a pair of rack ears 402 (e.g., 402*a*, 402*b*) protruding from the equipment module 10 at its rear end. At the front end of the equipment module 10, a first rack ear 102*a* extends outward from a first end of the equipment module 10 and a second rack ear 102*b* extends outward from a second end of the equipment module 10 opposite the first end. At the rear end of the equipment module 10, a third rack ear 402*a* extends outward from the first end of the equipment module 10 and a fourth rack ear 402*b* extends outward from the second end of the equipment module 10. This configuration of four rack ears 102a, 102b, 402a, 402b can be used to mount the equipment module 10 to an equipment rack that has four rack members (e.g., four-post rack, which is not shown in the figures).

FIGS. 5A-5D illustrate a rack ear 402 (e.g., 402a). In some instances, a pair of the rack ears 402 (e.g., 402a, 402b) can extend from the equipment module 10 at its rear end, as illustrated for example in FIGS. 4A-4B. The rack ear 402 can have a second member 404, as illustrated in FIGS. 5A-5D, thereby forming an angle bracket. In some examples, the second member 404 can be substantially perpendicular to the member 104. The second member can have more than one aperture 406 extending therethrough. One or more of the apertures 406 can receive a fastener (e.g., screw, bolt) therethrough to couple the second member 404 of the rack ear 402 to the equipment module 10. Then, the member 104, which extends outward from the equipment module 10, can be removably coupled to the equipment rack as previously described.

The foregoing merely illustrates the principles of the invention. While specific implementations are discussed, it should be understood that this is done for illustration purposes only. A person skilled in the relevant art will recognize that other components and positions may be used without parting from the spirit and scope of the disclosure. Thus, the previous description and the drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

While the invention has been described with respect to specific examples including presently preferred modes of carrying out the invention, those skilled in the art will appreciate that there are numerous variations and permutations of the above-described systems and techniques. It is to be understood that other embodiments may be utilized and structural and functional modifications may be made without departing from the scope of the present invention. Thus, the spirit and scope of the invention should be construed broadly as set forth in the appended claims.

Reference to "embodiment", "aspect," "instance," or "example" means that a particular feature, structure, or characteristic described in connection with the embodiment is included in at least one embodiment of the disclosure. The appearances of these phrases in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Additional features and advantages of the disclosure were set forth in the description above, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

What is claimed is:

1. A rack ear for mounting equipment in an equipment rack, the rack ear comprising:
   a first planar member comprising a plurality of apertures through which the first planar member is coupled to the equipment;
   a second planar member coupled to and extending substantially perpendicular from the first planar member at a mounting end of the second planar member, the second planar member further defining an end edge opposite the mounting end; and
   an elongate opening extending through the second planar member through the end edge of the second planar member and defining an upper lobe with an upper curvate surface and a lower lobe with a lower curvate surface to define a slot opening into the elongate opening between the upper lobe and the lower lobe, the slot receiving at least a portion of a shaft of a first support member comprising the shaft and a head and coupled to the equipment rack, wherein a width of the elongate opening is larger than a first radius of the upper curvate surface and a second radius of the lower curvate surface, the width of the elongate opening larger than a diameter of the head of the first support member,
   an upper slot defining a first hole through the second planar member above the elongate opening and a lower slot defining a second hole through the second planar member below the elongate opening, wherein the upper slot and the lower slot are spaced according to an aperture spacing on a corresponding rail of the equipment rack;
   wherein the elongate opening is symmetrical about a line defined by the slot opening into the elongate opening,
   wherein the second planar member defines a height of a 1U, 2U, 3U, or 4U dimension of a computing device.

2. The rack ear of claim 1, wherein the upper curvate surface or the lower curvate surface centers the equipment within the equipment rack when the upper curvate surface or the lower curvate surface engages the shaft of the first support member.

3. The rack ear of claim 2, whereby lowering the upper curvate surface of the upper lobe onto the shaft of the first support member inhibits both lateral movement and vertical movement of the second planar member with respect to the equipment rack.

4. The rack ear of claim 2, wherein the first radius of the upper curvate surface is the same as the second radius of the lower curvate surface, wherein the first radius of the upper curvate surface and the second radius of the lower curvate surface are greater than 3/32-inch.

5. The rack ear of claim 1, wherein the second planar surface engages a surface on a rail of the equipment rack when the second planar member receives one or more fasteners therethrough to removably secure the rack ear to the rail.

6. The rack ear of claim 1, wherein the elongate opening defines a height substantially similar to openings of two holes that are adjacent to each other on a corresponding rail of the equipment rack.

7. A computer rack mounting member comprising:
a first planar member comprising a plurality of apertures through which the first planar member is coupled to a computing element;
a second planar member extending substantially perpendicular from the first planar member at a mounting end of the second planar member, the second planar member defining a slot portion through an end edge of the second planar member opposite the mounting end, a first lobe with a first curvate surface, and a second lobe with a second curvate surface, the first lobe and second lobe symmetrically positioned relative to the slot portion, wherein the slot portion receives a head and at least a portion of a shaft of a first support member coupled to a first rack member of a computing rack by way of a substantially horizontal movement of the second planar member when positioning the computing element to be supported by the computing rack, wherein one of either the first lobe or the second lobe engages the shaft of the first support member through substantially vertical movement of the second planar member relative to the first rack member to seat the first support member in one of either the first lobe or the second lobe thereby inhibiting lateral movement and vertical movement of the second planar member relative to the support member; and
an upper slot defining a first hole through the second planar member above the elongate opening and a lower slot defining a second hole through the second planar member below the elongate opening, wherein the upper slot and the lower slot are spaced according to an aperture spacing on a corresponding rail of the equipment rack,
wherein a width of the elongate opening is larger than a first radius of the first curvate surface and a second radius of the second curvate surface.

8. The computer rack mounting member of claim 7, wherein seating the shaft of the first support member against either the first lobe or the second lobe defines a distance from the computing element to the first rack member of the computing rack.

9. The computer rack mounting member of claim 7 wherein the first radius of the first lobe and the second radius of the second lobe are each greater than 3/32-inch.

10. The computer rack mounting member of claim 7, wherein the first planar member is couplable to the computing element and the second planar member extends outwards therefrom.

11. The computer rack mounting member of claim 7, wherein the second planar member defines a planar surface that abuts the first rack member of the computing rack when the second planar member receives one or more fasteners therethrough to removably couple the computer rack mounting member to the computing rack.

12. The computer rack mounting member of claim 7, wherein the second planar member defines a height of a 1U, 2U, 3U, or 4U dimension of the computing element.

13. A rack system to support equipment, the rack system comprising:
an equipment rack including a first rail and a second rail;
a computing device mounted to the equipment rack via a plurality of mounting devices each including a first planar member comprising a plurality of apertures through which the respective planar member is coupled to the computing device and a second planar member extending substantially perpendicular from the first planar member at a mounting end of the second planar member, a first mounting device of the plurality of mounting devices supported by a first fastener installed into the first rail and a second mounting device of the plurality of mounting devices supported by a second fastener installed into the second rail,
wherein the second planar member of the first mounting device defines a first vertically symmetrical opening, the first vertically symmetrical opening including a slot through an end edge of the second planar member of the first mounting device opposite the mounting edge coupled to the computing device and into the first vertically symmetrical opening, the first vertically symmetrical opening defining a first top lobe with a first top curvate surface and a first bottom lobe with a first bottom curvate surface, the first symmetrical opening receiving a shaft of a first fastener comprising the shaft and a head and coupled to the equipment rack, wherein a width of the first vertically symmetrical opening is larger than a first radius of the first top curvate surface and a second radius of the first bottom curvate surface, the width of the first vertically symmetrical opening larger than a diameter of the head of the first fastener,
wherein the second planar member of the second mounting device defines a second vertically symmetrical opening, the second vertically symmetrical opening including a slot through an end edge of the second planar member of the second mounting device opposite the end edge coupled to the computing device and into the second vertically symmetrical opening, the second vertically symmetrical opening defining a second top lobe with a second top curvate surface and a second bottom lobe with a second bottom curvate surface, the second symmetrical opening receiving a shaft of a second fastener comprising the shaft and a head and coupled to the equipment rack wherein a width of the second vertically symmetrical opening is larger than a third radius of the second top curvate surface and a fourth radius of the second bottom curvate surface, the width of the second vertically symmetrical opening larger than a diameter of the head of the second fastener;
wherein the second planar member of the first mounting device comprise a first upper slot defining a first hole through the second planar member of the first mounting device above the first vertically symmetrical opening and a first lower slot defining a second hole through the second planar member of the first mounting device below the first vertically symmetrical opening, wherein the first upper slot and the first lower slot are spaced according to an aperture spacing on a corresponding rail of the equipment rack;

wherein the second planar member of the second mounting device comprise a second upper slot defining a first hole through the second planar member of the second mounting device above the second vertically symmetrical opening and a second lower slot defining a second hole through the second planar member of the second mounting device below the second vertically symmetrical opening, wherein the second upper slot and the second lower slot are spaced according to an aperture spacing on a corresponding rail of the equipment rack.

14. The rack system of claim 13, wherein the first top lobe or the first bottom lobe of the first vertically symmetrical opening and the second top lobe or the second bottom lobe of the second vertically symmetrical opening causes the computing device to center within the equipment rack when the first top lobe or the first bottom lobe of the first vertically symmetrical opening engages the shaft of the first fastener and the second top lobe or the second bottom lobe of the second vertically symmetrical opening engages the shaft of the second fastener.

15. The rack system of claim 13, wherein the curvate surface of the first vertically symmetrical opening and the curvate surface of the second vertically symmetrical opening causes the computing device to center within the equipment rack when the curvate surface of the first vertically symmetrical opening engages the shaft of the first fastener and the curvate surface of the second vertically symmetrical opening engages the shaft of the second fastener.

16. The rack system of claim 13, wherein the first vertically symmetrical opening of the second planar member of the first mounting device is substantially similar to two apertures adjacent to each other on the first rail, wherein the second vertically symmetrical opening of the second planar member of the second mounting device is substantially similar to two apertures that are adjacent to each other on the second rail.

* * * * *